(12) United States Patent
Liu et al.

(10) Patent No.: US 10,999,926 B2
(45) Date of Patent: May 4, 2021

(54) STRESS RELIEF ENCAPSULATION FOR FLEXIBLE HYBRID ELECTRONICS

(71) Applicant: Flex Ltd., Singapore (SG)

(72) Inventors: Weifeng Liu, Dublin, CA (US);
William L. Uy, San Jose, CA (US);
Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/450,631

(22) Filed: Jun. 24, 2019

(65) Prior Publication Data
US 2020/0404780 A1    Dec. 24, 2020

(51) Int. Cl.
*H01L 23/34* (2006.01)
*H01L 23/48* (2006.01)
*H01L 21/00* (2006.01)
*H05K 1/02* (2006.01)
*H05K 1/11* (2006.01)
*H05K 3/28* (2006.01)
*H05K 1/18* (2006.01)
*H05K 1/14* (2006.01)
*H01L 21/56* (2006.01)
(Continued)

(52) U.S. Cl.
CPC ......... *H05K 1/0281* (2013.01); *H01L 21/56* (2013.01); *H01L 51/0097* (2013.01); *H01L 51/5253* (2013.01); *H05K 1/0283* (2013.01); *H05K 1/0393* (2013.01); *H05K 1/118* (2013.01); *H05K 1/147* (2013.01); *H05K 1/189* (2013.01); *H05K 3/284* (2013.01); *H01L 23/3107* (2013.01)

(58) Field of Classification Search
CPC . H01L 23/3107; H01L 21/56; H01L 51/0097;
H01L 51/5253; H05K 2203/1316; H05K
2201/05; H05K 1/0277; H05K 1/0283;
H05K 1/118; H05K 3/284; H05K 1/189;
H05K 1/0393; H05K 1/147
See application file for complete search history.

(56) References Cited

U.S. PATENT DOCUMENTS 10,643,936 B2 *   5/2020   Hu .................... H01L 21/4857
2013/0249075 A1 *  9/2013   Tateiwa .............. H01L 24/24
                                                     257/734
(Continued)

OTHER PUBLICATIONS

"Versatility on a roll: Bonding and welding with thermoplastic adhesive films," Pontacol AG, Feb. 2017, 8 pages.
(Continued)

*Primary Examiner* — Alonzo Chambliss
(74) *Attorney, Agent, or Firm* — Sheridan Ross P.C.

(57) ABSTRACT

Methods, devices, and systems for producing a flexible electronic device that reduces stress and forces on electronic components are provided. In particular, one or more transition layers with intermediate flexibility, or flexural modulus, are positioned between rigid components and flexible outer layers. This gradually reduces the flexural modulus of the flexible electronics device rather than have an interface between a rigid material and a flexible material. Various materials and methods of forming the layers are described. In addition, an encapsulate layer can be cured to varying flexural moduli to gradually reduce the flexural moduli from the rigid component to the flexible outer layers or bulk structure of the flexible electronic device.

9 Claims, 12 Drawing Sheets

(51) Int. Cl.
*H01L 51/00* (2006.01)
*H01L 51/52* (2006.01)
*H05K 1/03* (2006.01)
*H01L 23/31* (2006.01)

(56) References Cited

U.S. PATENT DOCUMENTS

2014/0306348 A1\* 10/2014 Ahn .................... H05K 1/0281
 257/773
2015/0179560 A1\* 6/2015 Arisaka ................ H05K 1/0313
 257/777

OTHER PUBLICATIONS

"Thermoplastic Polyurethane Elastomers-Elastollan Material Properties," BASF, Sep. 2017, 52 pages.
"Overview of materials for Epoxy Molding Compound," MatWeb, May 2019, 4 pages.
"Overview of materials for Thermoplastic Polyurethane (TPUR), Polyester Grade," MatWeb, May 2019, 7 pages.

\* cited by examiner

STRESS RELIEF ENCAPSULATION FOR FLEXIBLE HYBRID ELECTRONICS

FIELD

The present disclosure is generally directed to flexible electronic structures with rigid electronic components.

BACKGROUND

Traditional electronic devices are rigid in nature. Many electronic devices utilize a printed circuit board that electrically and mechanically supports electronic components such as processors, hard drives, random access memory, power supplies, etc. Even when the wires that connect these electronic components are flexible to aid in the assembly of the electronic device, the distances between the electronic components are fixed. A printed circuit board can have layers with different materials to serve a variety of purposes. For example, copper can be used as a conductor for electrical connectivity, and laminates can be used for mechanical rigidity. This printed circuit board construction is sufficient for uses such as a desktop computer or other end uses that are largely stationary.

However, there is an increased need for flexible electronic devices that bend and conform to different shapes. For example, wearable electronic devices would necessarily vary in shape with a body in motion or conform to a rounded shape of a body part, and, for example, an electronic playbook could conform to an arm of an athlete or an electronic map could conform to an arm of a soldier. Further, flexible electronics can be used in manufacturing processes. Yet there are several issues with flexible electronic devices. For instance, flexible materials are used in an electronic device where rigid materials were previously used, and the flexible materials introduce new problems. A previous interface between a rigid component and a rigid substrate is now an interface between a rigid component and a flexible substrate, and the distances between electronic components are variable. Now the rigid-flexible interface concentrates stresses at electronic components as the substrate flexes and stretches, and the stresses damage the component itself and/or damage wires and connections between electronic components. The electronic components can be encapsulated in rigid reinforcing material to the point where the electronic components are not damaged by flexing or stretching of a pliable substrate, but the resulting the electronic device is less flexible, which negates the benefit of having a flexible electronic device.

BRIEF SUMMARY

Methods, devices, and systems for relieving stress on electronic components in a flexible electronic device are provided. In particular, at least one transition layer is positioned between a rigid reinforcement layer on an electronic component and a flexible bulk material or outer layer of the flexible electronic device. This arrangement creates interfaces away from the electronic component, for example, the transition layer-outer layer interface, and gradually reduces stresses on the electronic component while preserving the flexible nature of the flexible electronic device.

According to one embodiment, a reinforcement layer is provided to connect an electronic component to a flexible substrate or bulk material of the flexible electronic device. The reinforcement layer is rigid and prevents stresses from concentrating on the electronic component itself. The reinforcement layer can be positioned on a bottom surface of the electronic component, an outer perimeter of the electronic component, fully encapsulate the electronic component, etc. As discussed in further detail below, one or more transition layers can help relieve stress, and as a result, in some embodiments, the reinforcement layer can be smaller and/or less rigid to preserve the flexible nature of the electronic device.

According to one embodiment, at least one transition layer is positioned between a reinforcement layer of an electronic device and a flexible outer layer. The at least one transition layer has a flexural modulus that is between the rigid flexural modulus of the reinforcement layer and the more flexible flexural modulus of the outer layer. This provides a gradual transition from the rigid component to the flexible outer layer. The inclusion of at least one transition layer creates an interface between a reinforcement layer and at least on transition layer, an interface between transition layers if there are multiple transition layers, an interface between the at least one transition layer and an outer layer interface, etc. Stresses concentrate at each of these interfaces instead of only at the electronic component-flexible material interface, as was the case in prior art devices. As a result, stresses and forces are distributed over a larger area, which reduces the concentration of forces on the electronic component itself. Thus, a flexible electronic device with the at least one transition layer can have both flexibility and a distribution of forces.

According to one embodiment, the at least one transition layer is a single layer that covers a single electronic component. Thus, the single transition layer is positioned between the electronic component and the flexible outer layer. Other components on the same substrate may have other, respective transition layers with subportions of the outer layer positioned between transition layers.

According to one embodiment, the at least one transition layer is at least two transition layers that cover a single component. Thus, in one example, a first transition layer and a second transition layer are positioned between the electronic component and the flexible outer layer. Other components on the same substrate may have other, respective transition layers with subportions of the outer layer positioned between transition layers. In other embodiments, the at least one transition layer is a common transition layer that covers multiple electronic components. Thus, the common transition layer is positioned between at least two electronic components and the flexible outer layer.

According to one embodiment, an encapsulate layer is formed on a substrate with electronic components, and the encapsulate layer is cured to form areas with different flexural moduli. A curing device such as an ultraviolet light can cure the encapsulate layer longer and/or more intensely over the electronic components to make the encapsulate layer more rigid with a high flexural modulus around the electronic components. Then, the curing device can reduce flexural modulus of the encapsulate layer away from the electronic components. The curing device can form discrete areas of different flexural moduli in the encapsulate layer or form continuously changing areas of flexural moduli in the encapsulate layer so there are no boundaries or interfaces between two areas of the encapsulate layer with different flexural moduli.

According to one embodiment, a shield is positioned between the curing device and the encapsulate layer where the shield allows varying intensities of electromagnetic radiation to pass through the shield, resulting in varying areas of flexural moduli in the encapsulate layer.

According to one embodiment, at least one transition layer is positioned between the rigid reinforcement layer and the flexible substrate in the vertical direction or planar direction of the flexible electronic device. As described herein with respect to the planar direction, one or more transition layers can gradually relieve the concentration of stresses in the vertical direction to preserve the flexible nature of the electronic device.

According to one embodiment, a wire that connects electronic components can have a first wire structure in the one or more transition layers and another structure in the outer layer. In one embodiment, the wire is straight in the transition layers and has zig-zag shape in the flexible outer layer. Thus, the wire has slack that can accommodate an increased length in the flexible outer layers.

These and other advantages will be apparent from the disclosure of the aspects, embodiments, and configurations contained herein.

Unless otherwise noted, all component or composition levels are in reference to the active portion of that component or composition and are exclusive of impurities, for example, residual solvents or by-products, which may be present in commercially available sources of such components or compositions.

All percentages and ratios are calculated by total composition weight, unless indicated otherwise.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein. By way of example, the phrase from about 2 to about 4 includes the whole number and/or integer ranges from about 2 to about 3, from about 3 to about 4 and each possible range based on real (e.g., irrational and/or rational) numbers, such as from about 2.1 to about 4.9, from about 2.1 to about 3.4, and so on.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

It should be understood that the diagrams are provided for example purposes only and should not be read as limiting the scope of the disclosure. Many other configurations are fully contemplated and included in the scope of the disclosure.

DETAILED DESCRIPTION

It is with respect to the above issues and other problems that the embodiments presented herein were contemplated. In general, embodiments of the present disclosure provide flexible electronic devices and circuit boards and methods for manufacturing the same. Due to the features described in further detail below, the electronic device can bend, flex, and stretch without concentrating forces on the electronic components.

Figure 1:
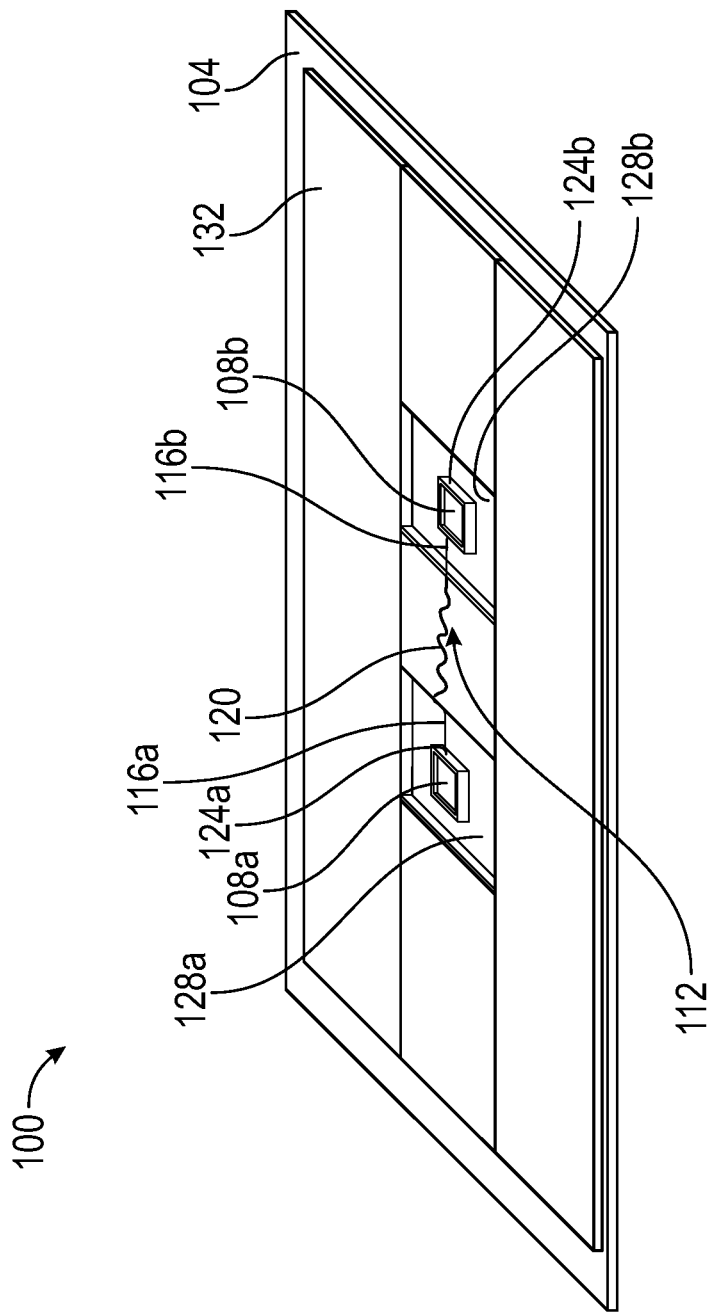
FIG. 1 is a perspective view of a flexible electronic device in accordance with embodiments of the present disclosure.

FIG. 1 is a perspective view of a flexible electronic device 100. A substrate 104 is provided that is flexible in nature, and components 108a, 108b are positioned on the substrate 104. As shown, an exemplary wire 112 extends between the components 108a, 108b. The wire 112 has straight sections 116a, 116b where less flexing of the electronic device 100 is expected, and the wire 112 has a non-straight section 120 where more flexible of the electronic device 100 is expected. In this embodiment, the non-straight section 120 has a zig-zag pattern of straight sub-sections. However, it will be appreciated that the non-straight section 120 may have, for example, a sinusoidal shape or other shapes that have slack material to accommodate flexing and stretching of the electronic device. It will be further appreciated that any combination of straight and non-straight sections 116, 120 can be used to join components 108.

Reinforcement layers 124a, 124b are formed or dispensed around and/or underneath the components 108a, 108b, and the reinforcement layers 124a, 124b connect the respective components 108a, 108b to the substrate 104. The reinforcement layers 124a, 124b can be the sole connection between the respective components 108a, 108b to the substrate 104 or an additional connection, meaning in addition to another connection between the components 108a, 108b to the substrate 104. Regardless, the reinforcement layers 124a, 124b are rigid to prevent flexing and stretching stresses from the substrate 104 and the flexible electronic device 100 from damaging the components 108a, 108b.

Next, transition layers 128a, 128b are formed or molded to the respective reinforcement layers 124a, 124b and components 108a, 108b, and an outer layer 132 is formed or molded to the transition layers 128a, 128b. In some embodiments, the transition layers 128a, 128b are more flexible than the reinforcement layers 124a, 124b and components 108a, 108b but less flexible than the outer layer 132. This can be expressed in terms of a flexural modulus, and the arrangement of the layers provides a more gradual reduction in flexural modulus from the rigid components 108a, 108b and reinforcement layers 124a, 124b to the flexible outer layer 132. As a result, the electronic device 100 retains flexibility, but there is less stress on the components 108a, 108b when the electronic device 100 flexes and stretches. As described in further detail below, a variety of materials and forming methods can be used to manufacture the flexible electronic device 100. In addition, it will be appreciated that the flexible or rigid nature of feature can not only be expressed in terms of a flexural modulus but also in other terms. For example, the elastic modulus of a material is a quantity that measures an object or substance's resistance to being deformed elastically (i.e., non-permanently) when a stress is applied to it. The elastic modulus of an object is defined as the slope of its stress-strain curve in the elastic deformation region. Further, stiffness is a measure of the resistance offered by an elastic body to deformation expressed in force over displacement, and various hardness scales can characterize the layers.

Figure 2A:
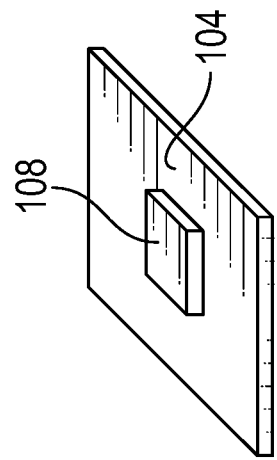
FIG. 2A is a perspective view of a substrate and component in accordance with embodiments of the present disclosure.
Figure 2B:
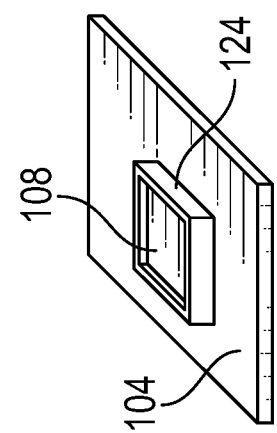
FIG. 2B is a perspective view of a substrate, component, and reinforcement layer in accordance with embodiments of the present disclosure.
Figure 2C:
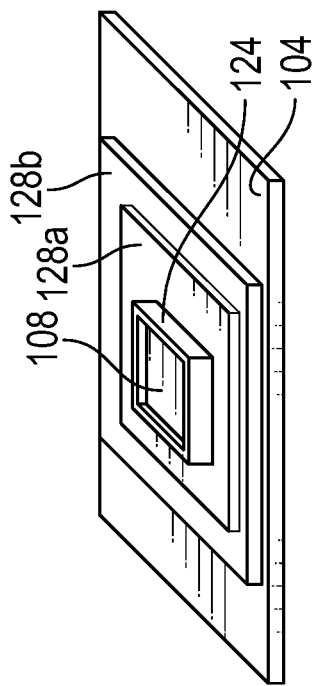
FIG. 2C is a perspective view of a flexible electronic device in accordance with embodiments of the present disclosure.

FIGS. 2A-2D show various views of a substrate 104 and layers. FIG. 2A shows a component 108 positioned on a substrate 104, and FIG. 2B shows a reinforcement layer 124 dispensed around an outer perimeter of the component 108 to reduce stresses on the component 108. Next, FIG. 2C shows the addition of two different transition layers 128a, 128b. The shape of the transition layers 128a, 128b in FIG. 2C and other figures herein is shown as rectangular. It will be appreciated that in some embodiment, the shape lacks any edges to reduce the concentration of stresses.

Figure 2D:
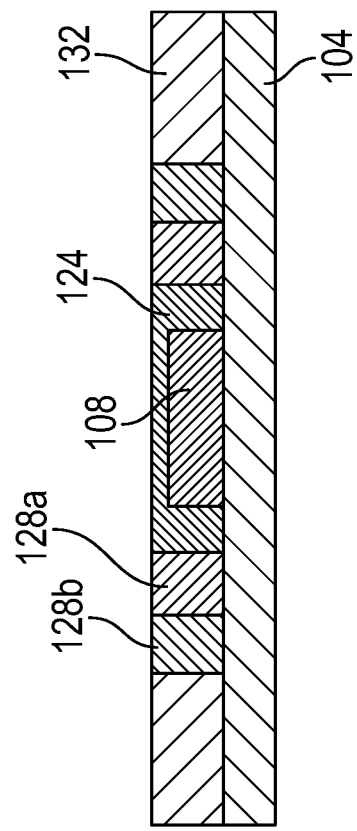
FIG. 2D is a cross-sectional elevation view of the flexible electronic device in FIG. 2C in accordance with embodiments of the present disclosure.
Figure 3A:
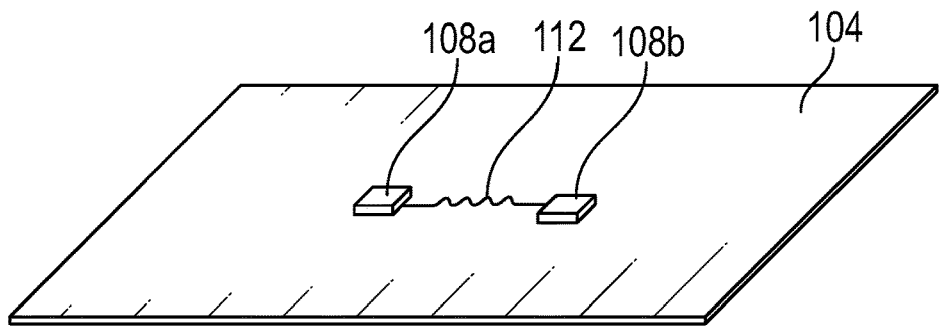
FIG. 3A is perspective view of a substrate and components in accordance with embodiments of the present disclosure.
Figure 3B:
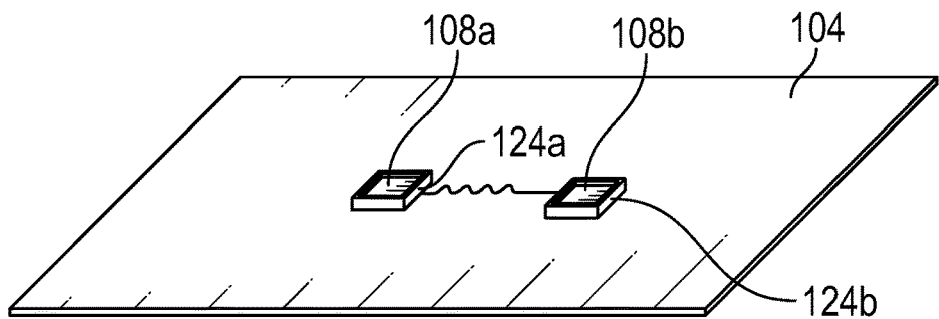
FIG. 3B is a perspective view of the substrate of FIG. 3A and a reinforcement layer in accordance with embodiments of the present disclosure.
Figure 3C:
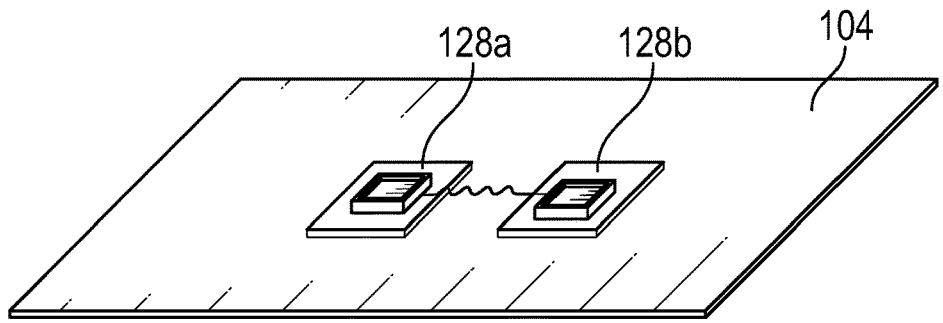
FIG. 3C is a perspective view of the substrate of FIG. 3B and transition layers in accordance with embodiments of the present disclosure.
Figure 3D:
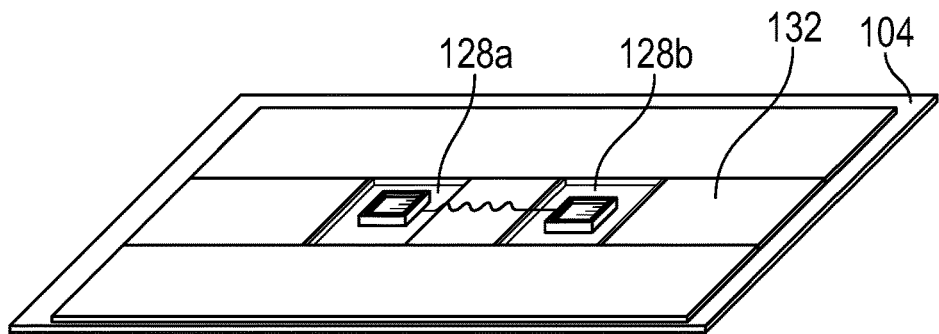
FIG. 3D is a perspective view of the substrate of FIG. 3C and an outer layer in accordance with embodiments of the present disclosure.

FIG. 2D is a cross-sectional view of the substrate 104 and the layers with the addition of an outer layer 132. As discussed above, flexibility can be expressed in terms of a flexural modulus, or an intensive property that is computed as the ratio of stress to strain in flexural deformation, or the tendency for a material to resist bending. The component 108 is rigid and the reinforcement layer 124 is rigid. In various embodiments, the component 108 can have a greater, equal, or lesser flexural modulus than the reinforcement layer 124. In addition, the reinforcement layer 124 can surround the component 108 in some embodiments, as shown in FIG. 2D, or the reinforcement layer 124 can connect to an outer perimeter of the component 108 and to the substrate 104. Further, the reinforcement layer 124 can be positioned between a bottom surface of the component 108 and a top surface of the substrate 104.

The first transition layer 128a is molded to the reinforcement layer 104 in this embodiment, and the flexural modulus of the first transition layer 128a is less than the flexural modulus of the reinforcement layer 124. Next, the second transition layer 128b is molded to the first transition layer 128a, and the flexural modulus of the second transition layer 128b is less than the flexural modulus of the first transition layer 128a. Then, an outer layer 132 is molded to the second transition layer 128b, and the flexural modulus of the outer layer 132 is less than the flexural modulus of the second transition layer 128b. It will be appreciated that the flexural modulus of the outer layer 132 can be the same or approximately the same as the flexural modulus of the substrate 104, where the term "approximately" can mean less than a 5% relative difference. The layers as shown in FIG. 2D provide a gradual reduction in flexibility to preserve the integrity of the component 108 rather than an abrupt change from the component 108 to the substrate 104 or outer layer 132. While this gradual reduction in flexural modulus is shown in a planar direction, it will be appreciated than a transition layer or layers 128a, 128b can extend in any direction from the component 108, including the vertical direction perpendicular to the planar direction.

FIGS. 3A-3D show an embodiment of the flexible electronic device. The components 108a, 108b and the wire 112 connecting the components are positioned on a substrate 104, and reinforcement layers 124a, 124b are dispensed between the components 128a, 128b and the substrate 104. Then, one transition layer 128a is molded to the first component 108a and reinforcement layer 124a, and another transition layer 128b is molded to the second component 108b and reinforcement layer 124b. An outer layer 132 is then molded to the transition layers 128a, 128b. Portions of the outer layer 132 extend between the transition layers 128a, 128b and around the transition layers 128a, 128b. As shown, the outer layer 132 can be molded in a single layer or sublayers. In various embodiments, the flexural modulus of the reinforcement layer is between approximately 10 and 20 GPa, and the flexural modulus of the outer layer is between approximately 0.01 and 2 GPa. It will be appreciated that these values are exemplary in nature, and the flexural moduli can be lesser or greater than these values in different embodiments. In addition, in some embodiments the reinforcement layers 124a, 124b can be an epoxy material or an acrylic material, and the outer layer 132 can be a silicone material or a thermoplastic polyurethane material.

Figure 4:
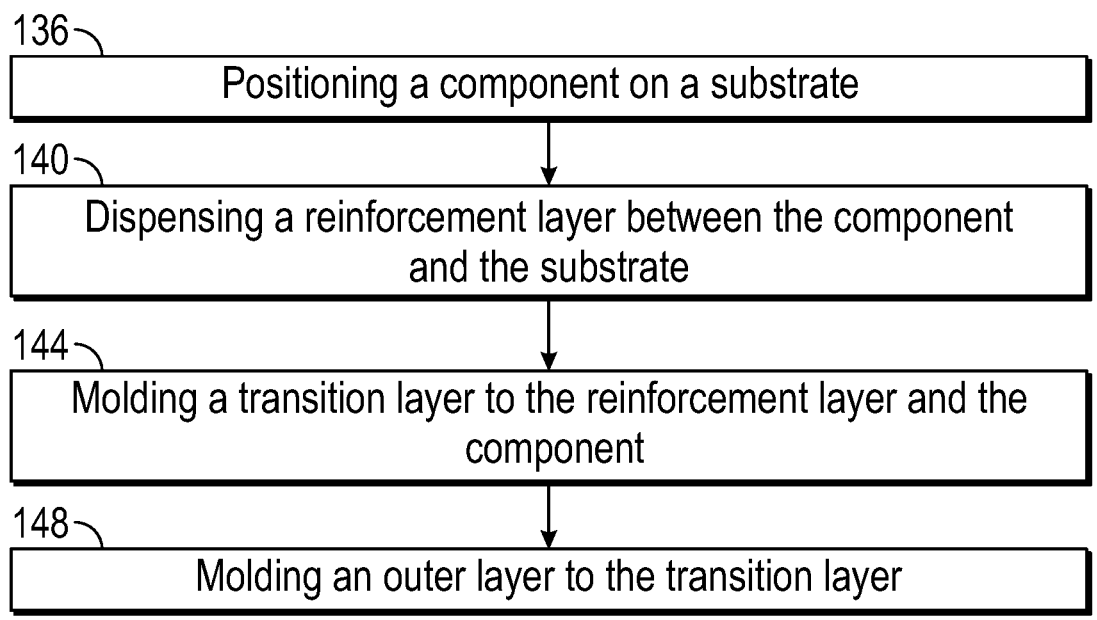
FIG. 4 is a schematic view of a process for manufacturing a flexible electronic device.
Figure 5A:
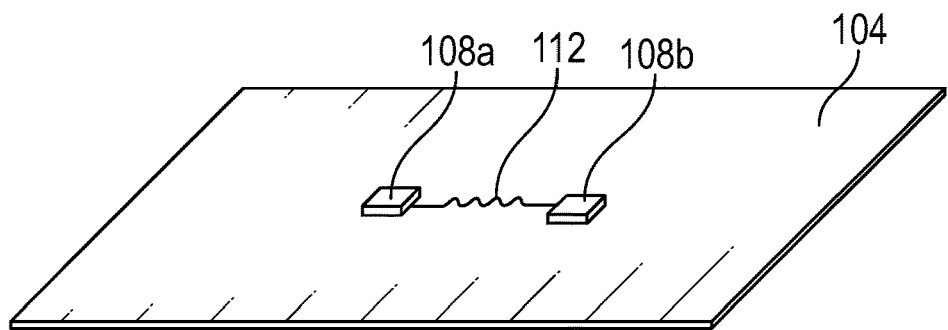
FIG. 5A is a perspective view of a substrate and components in accordance with embodiments of the present disclosure.
Figure 5B:
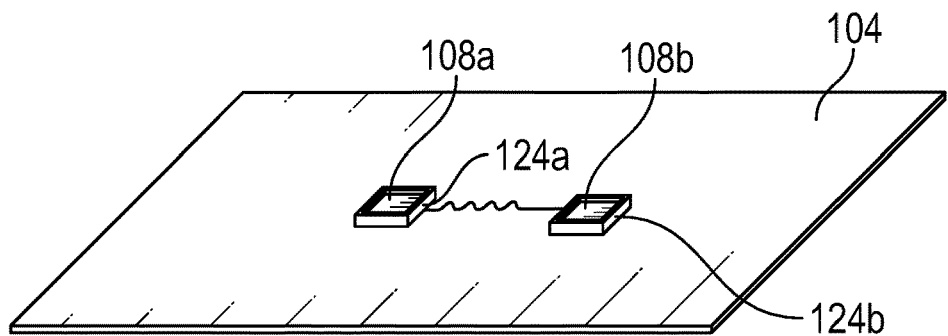
FIG. 5B is a perspective view of the substrate of FIG. 5A and a reinforcement layer in accordance with embodiments of the present disclosure.
Figure 5C:
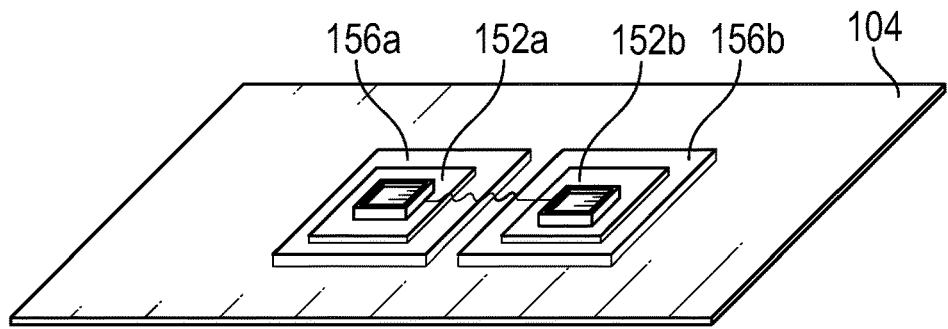
FIG. 5C is a perspective view of the substrate of FIG. 5B and multiple transition layers in accordance with embodiments of the present disclosure.
Figure 5D:
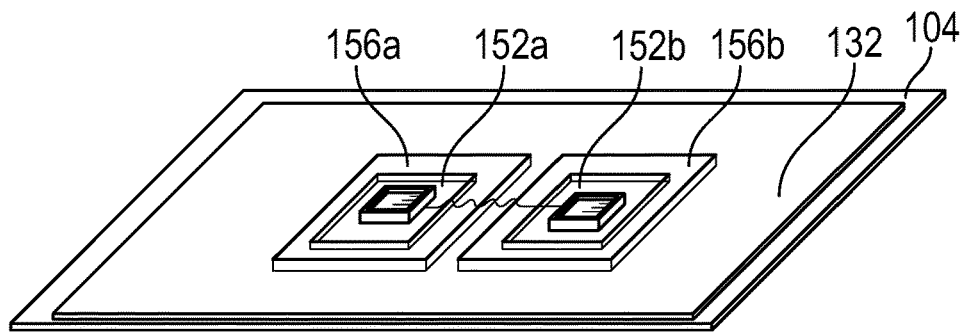
FIG. 5D is a perspective view of the substrate of FIG. 5C and an outer layer in accordance with embodiments of the present disclosure.

FIG. 4 shows a sequence of manufacturing the flexible electronic device from FIGS. 3A-3D. First, the components and the wires are positioned 136 on the substrate. This can include directly connecting the components and/or the wires to the substrate or locating the components and wires on the substrate until a reinforcement layer connects the components and/or wires to the substrate. Next, the reinforcement layer is dispensed 140 between the components and the substrate. Then, a transition layer is molded 144 to the reinforcement layer, and an outer layer is molded 148 to the transition layer. There are many different ways to dispense and mold the above layers including, but not limited to, screen printing, dispensing, casting, low pressure molding, and compression molding.

FIGS. 5A-5D show another embodiment of the flexible electronic device. The components 108a, 108b and the wire 112 connecting the components are positioned on a substrate 104, and reinforcement layers 124a, 124b are dispensed between the components 128a, 128b and the substrate 104. Then, first and second transition layers 152a, 156a are molded to the first component 108a and reinforcement layer 124a, and additional first and second layers 152b, 156b are molded to the second component 108b and reinforcement layer 124b. An outer layer 132 is then molded to the second transition layers 156a, 156b. Portions of the outer layer 132 extend between the second transition layers 156a, 156b and around the second transition layers 156a, 156b. As shown, the outer layer 132 can be molded in a single layer or sublayers.

The at least one transition layer can have multiple transition layers, and the flexural modulus of the at least one transition layer can be expressed in terms of an average transition flexural modulus. In one embodiment, the average transitional flexural modulus is an average of the flexural modulus of the first transition layer and the flexural modulus of the second transition layer. In further embodiments, this average is weighted by the area covered by the first transition layer and the area covered by the second transition layer. Accordingly, the average flexural modulus can be less than the flexural modulus of the reinforcement layer and greater than the flexural modulus of the outer layer.

Figure 6:
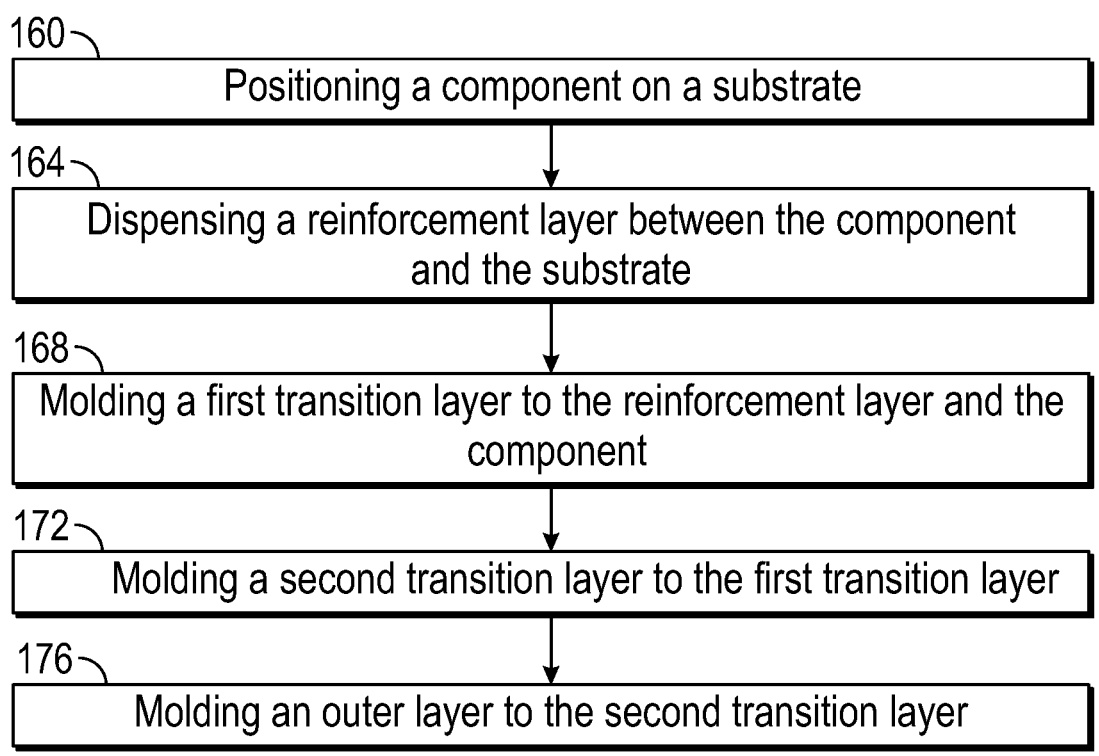
FIG. 6 is a schematic view of a process for manufacturing a flexible electronic device.
Figure 7A:
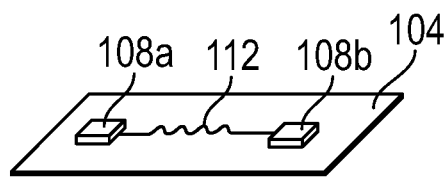
FIG. 7A is a perspective view of a substrate and components in accordance with embodiments of the present disclosure.
Figure 7B:
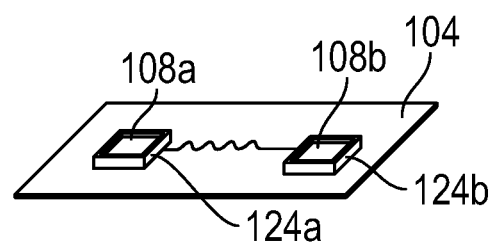
FIG. 7B is a perspective view of the substrate of FIG. 7A and a reinforcement layer in accordance with embodiments of the present disclosure.
Figure 7C:
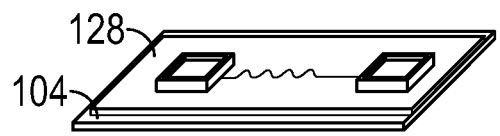
FIG. 7C is a perspective view of the substrate of FIG. 7B and a common transition layer in accordance with embodiments of the present disclosure.
Figure 7D:
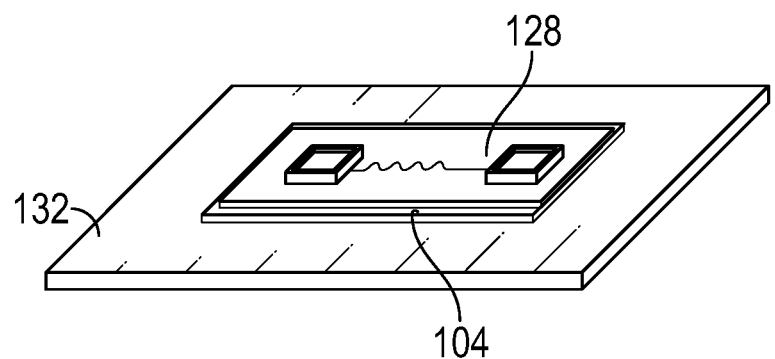
FIG. 7D is a perspective view of the substrate of FIG. 7C and an outer layer in accordance with embodiments of the present disclosure.

FIG. 6 shows a sequence of manufacturing the flexible electronic device from FIGS. 5A-5D. First, the components and the wires are positioned 160 on the substrate, and the reinforcement layer is dispensed 164 between the components and the substrate. Then, first transition layers are molded 168 to the reinforcement layers, second transition layers are molded 172 to the first transition layers, and an outer layer is molded 176 to the transition layers.

FIGS. 7A-7D show another embodiment of the flexible electronic device. The components 108a, 108b and the wire 112 connecting the components are positioned on a substrate 104, and reinforcement layers 124a, 124b are dispensed between the components 128a, 128b and the substrate 104. Then, a common transition layer 128 is molded to the first component 108a and reinforcement layer 124a as well as an additional second component 108b and reinforcement layer 124b. An outer layer 132 is then molded to the transition layer 128.

Figure 8:
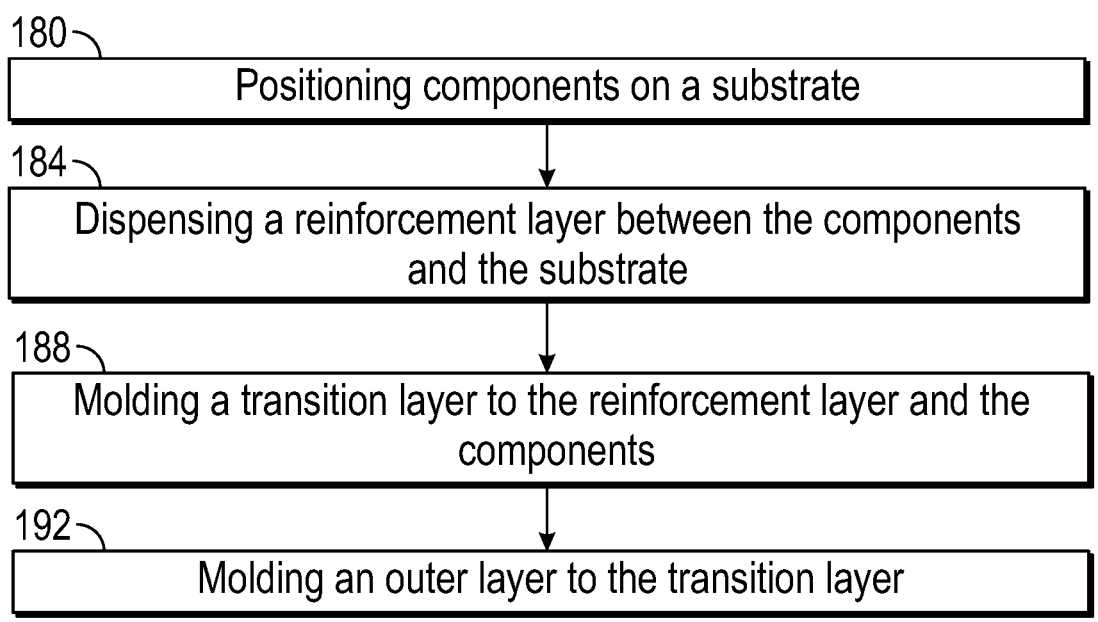
FIG. 8 is a schematic view of a process for manufacturing a flexible electronic device.

FIG. 8 shows a sequence of manufacturing the flexible electronic device from FIGS. 7A-7D. First, the components and the wires are positioned 180 on the substrate, and the reinforcement layer is dispensed 184 between the components and the substrate. Then, the common transition layer is molded 188 to the reinforcement layers, and an outer layer is molded 192 to the transition layer.

FIGS. 9A-9D show a further embodiment of the flexible electronic device. The components 108a, 108b and the wire 112 connecting the components are positioned on a substrate 104, and reinforcement layers 124a, 124b are dispensed between the components 128a, 128b and the substrate 104. Then an encapsulate layer 196 is molded to the reinforcement layers 124a, 124b and components 108a, 108b. Then a curing device 200, such as an ultraviolet light source, emits electromagnetic radiation, such as ultraviolet light, into the encapsulate layer 196 to cure at least a portion of the encapsulate layer 196 to a higher flexural modulus. The curing device 200 can cure an area around the components 108a, 108b to a higher flexural modulus and then taper to a reduced flexural modulus further away from the components 108a, 108b. In some embodiments, the flexural modulus of the encapsulate layer 196 tapers to an uncured area of the encapsulate layer 196. In various embodiments, the flexural modulus of the encapsulate layer 196 tapers to a flexural modulus that is approximately equal to the flexural modulus of the substrate 104, and the material of the encapsulate layer 196 can be the same as the material of the substrate 104. Thus, in some embodiments, the flexural modulus of the encapsulate layer 196 continuously changes rather than have discrete interfaces between two layers that have distinct flexural moduli.

Figure 9A:
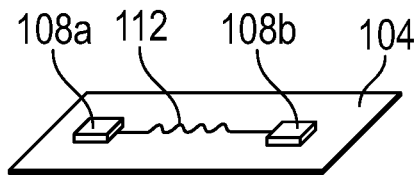
FIG. 9A is a perspective view of a substrate and components in accordance with embodiments of the present disclosure.
Figure 9B:
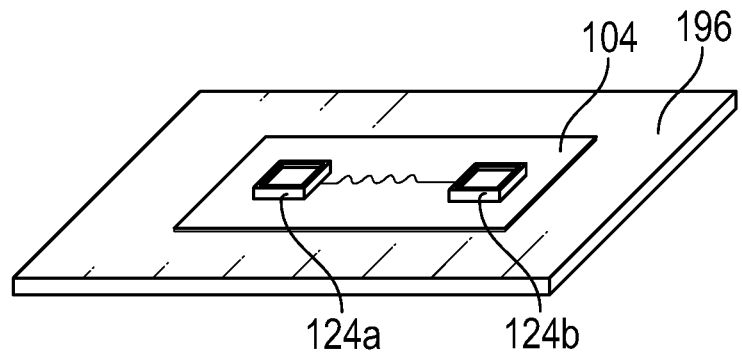
FIG. 9B is a perspective view of the substrate of FIG. 9A and an encapsulate layer in accordance with embodiments of the present disclosure.
Figure 9C:
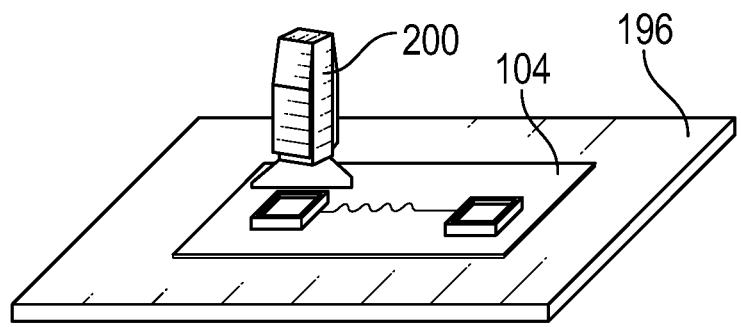
FIG. 9C is a perspective view of the substrate of FIG. 9B and a curing device in accordance with embodiments of the present disclosure.
Figure 9D:
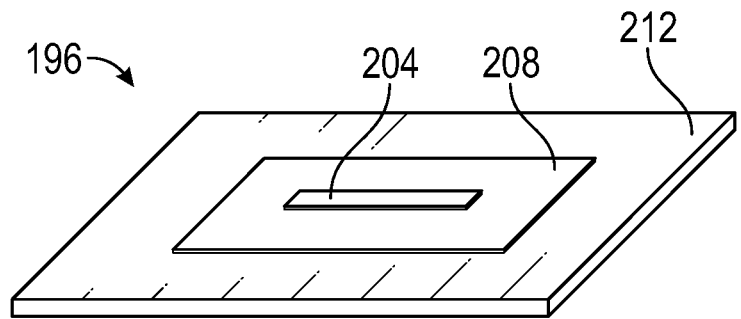
FIG. 9D is a perspective view of the encapsulate layer of FIG. 9C in accordance with embodiments of the present disclosure.

FIG. 9D shows a cured encapsulate layer 196 with a rigid area 204, a transition area 208, and an outer area 212. The flexural modulus of the rigid area 204 is greater than a flexural modulus of the transition area 208, which has a greater flexural modulus than the outer area 212. Although as depicted as discrete regions, it will be appreciated that the flexural modulus of the encapsulate layer 196 can continuously change as described above.

Figure 10:
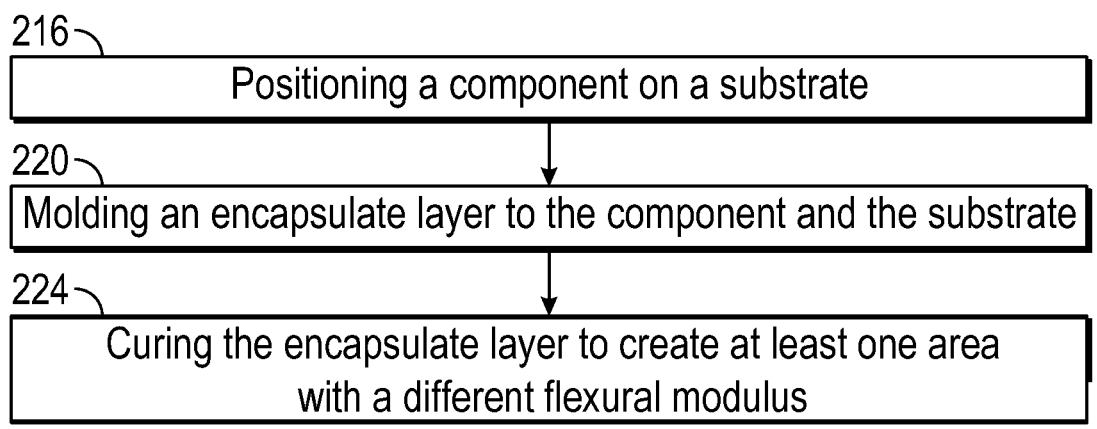
FIG. 10 is a schematic view of a process for manufacturing a flexible electronic device.

FIG. 10 shows a sequence of manufacturing the flexible electronic device from FIGS. 9A-9D. First, the components and the wires are positioned 216 on the substrate, and the reinforcement layer is dispensed between the components and the substrate. Then, an encapsulate layer is molded 220 to the components and the substrate, and the encapsulate layer is cured 224.

In some embodiments, the encapsulate layer 196 can completely surround the substrate 104 and components 108a, 108b, for example, between two encapsulate layers. Further still, the curing device 200 can create different areas with different flexural moduli in different ways. In some embodiments, the curing device 200 has a fixed intensity of electromagnetic radiation, and thus, the degree to which an area of the encapsulate layer 196 is cured depends on the dwell time of the curing device 200 over the area. In various embodiments, the curing device 200 emits electromagnetic radiation with varying intensity to cure different areas of the encapsulate layer 196 with different flexural moduli. In yet further embodiments, the curing device 200 can use a combination of dwell time and varying intensity. Curing can relate to the degree of polymerization of the encapsulate layer 196, meaning the degree to which molecules are linked. Thus, a higher degree or amount of linked molecules in an area of the encapsulate layer 196 results in a higher flexural modulus.

FIGS. 11A-11D show a further embodiment of the flexible electronic device. The components 108a, 108b and the wire 112 connecting the components are positioned on a substrate 104, and reinforcement layers 124a, 124b are dispensed between the components 128a, 128b and the substrate 104. Then an encapsulate layer 196 is molded to the reinforcement layers 124a, 124b and components 108a, 108b. Next, a shield 228 is positioned above the substrate 104, and a curing device 200, such as an ultraviolet light source, emits electromagnetic radiation, such as ultraviolet light, into the encapsulate layer 196 to cure at least a portion of the encapsulate layer 196 to a higher flexural modulus. The shield 228 allows varying intensity of electromagnetic radiation to pass through the shield 228. Thus, the curing device 200 can emit a constant intensity of electromagnetic radiation and a varying intensity of the electromagnetic radiation passes through the shield 228. As a result, the encapsulate layer has a correspondingly varying flexural moduli.

Figure 11A:
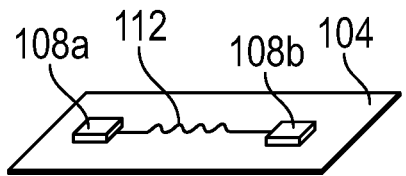
FIG. 11A is a perspective view of a substrate and components in accordance with embodiments of the present disclosure.
Figure 11B:
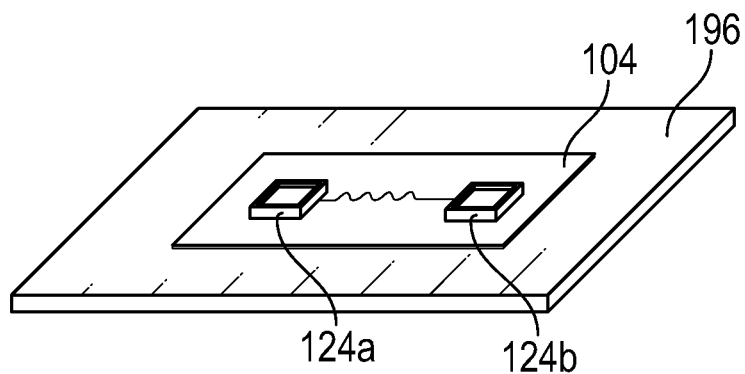
FIG. 11B is a perspective view of the substrate of FIG. 11A and an encapsulate layer in accordance with embodiments of the present disclosure.
Figure 11C:
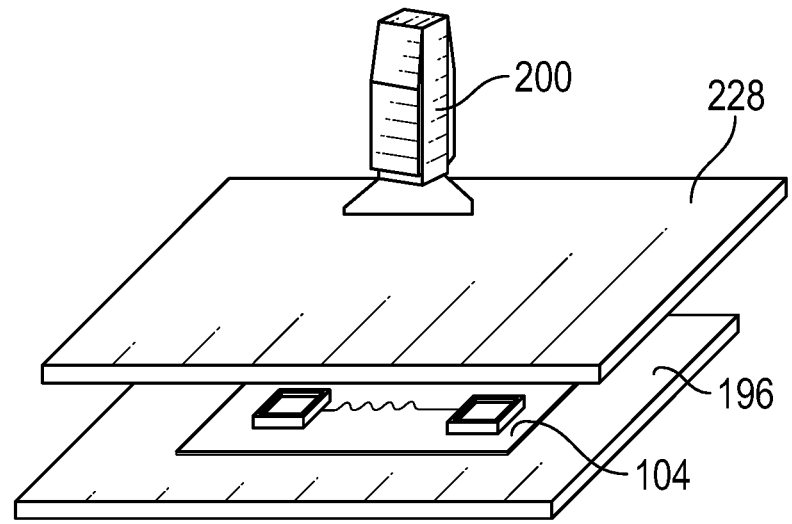
FIG. 11C is a perspective view of the substrate of FIG. 11B and a curing device and shield in accordance with embodiments of the present disclosure.
Figure 11D:
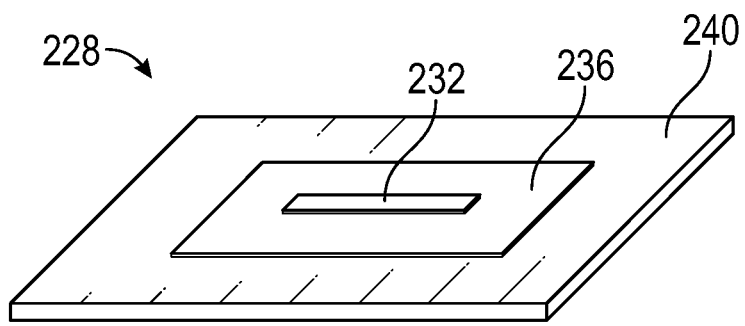
FIG. 11D is a perspective view of the shield of FIG. 11C in accordance with embodiments of the present disclosure.

FIG. 11D shows another view of the shield 228 that has a transparent area 232, which permits the highest intensity of electromagnetic radiation to pass through, a less transparent area 236, which permits a lesser intensity of electromagnetic radiation to pass through, and a lesser transparent area 240, which permits an even less intensity of electromagnetic radiation to pass through. In some embodiments, the outer area 240 permits no electromagnetic radiation to pass through so that the encapsulate layer 196 below the outer area 240 will retain its original flexural modulus. Further, while three discrete areas 232, 236, 240 are depicted in FIG. 11D, it will be appreciated that the shield 228 may comprises continuously changing areas so that the shield continuously permits less electromagnetic radiation intensity from an area above the components to an outer area.

Figure 12:
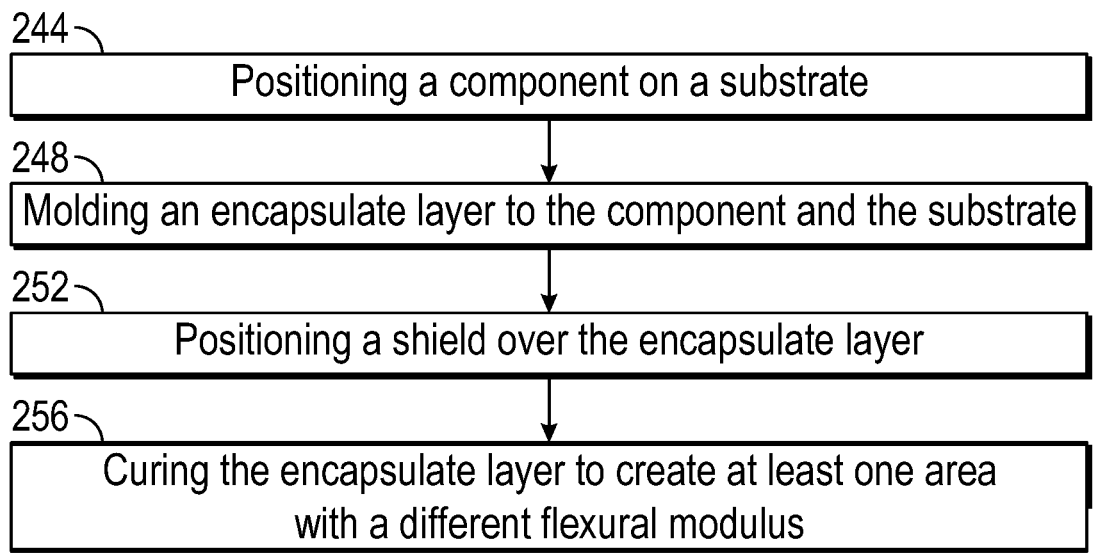
FIG. 12 is a schematic view of a process for manufacturing a flexible electronic device.

FIG. 12 shows a sequence of manufacturing the flexible electronic device from FIGS. 11A-11D. First, the components and the wires are positioned 244 on the substrate, and the reinforcement layer is dispensed between the components and the substrate. Then, an encapsulate layer is molded 248 to the components and the substrate. A shield is positioned 252 over the encapsulate layer, and then the curing device cures 256 the encapsulate layer.

It will be appreciated that heat can be used to cure the encapsulate layer in some embodiments. Thus, the curing device 200 depicted in the figures may apply increased heat to the encapsulate layer and/or shield. Different heat intensities or dwell times can result in different flexural moduli.

The present disclosure, in various aspects, embodiments, and configurations, includes components, methods, processes, systems and/or apparatus substantially as depicted and described herein, including various aspects, embodiments, configurations, subcombinations, and subsets thereof. Those of skill in the art will understand how to make and use the various aspects, aspects, embodiments, and configurations, after understanding the present disclosure. The present disclosure, in various aspects, embodiments, and configurations, includes providing devices and processes in the absence of items not depicted and/or described herein or in various aspects, embodiments, and configurations hereof, including in the absence of such items as may have been used in previous devices or processes, e.g., for improving performance, achieving ease and\or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more, aspects, embodiments, and configurations for the purpose of streamlining the disclosure. The features of the aspects, embodiments, and configurations of the disclosure may be combined in alternate aspects, embodiments, and configurations other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed aspects, embodiments, and configurations. Thus, the following claims are hereby incorporated into this Detailed Description, with each claim standing on its own as a separate preferred embodiment of the disclosure.

Moreover, though the description of the disclosure has included description of one or more aspects, embodiments, or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

One particular embodiment of the present disclosure is a flexible electronic device, comprising a substrate having a substrate flexural modulus; a component supported by a surface of the substrate; a reinforcement layer located between the surface of the substrate and the component, the reinforcement layer having a reinforcement flexural modulus that is greater than the substrate flexural modulus; at least one transition layer having a transition flexural modulus that is less than the reinforcement flexural modulus; and an outer layer having an outer flexural modulus that is less than the transition flexural modulus, wherein the at least one transition layer is positioned between the reinforcement layer and the outer layer.

In some embodiments of the disclosure, the at least one transition layer comprises a single transition layer that is connected to the reinforcement layer and is connected to the outer layer. In various embodiments of the disclosure, the at least one transition layer comprises a first transition layer that is connected to the reinforcement layer and comprises a second transition layer that is connected to the first transition layer and is connected to the outer layer, the first transition layer having a first transition flexural modulus that is less than the reinforcement flexural modulus, and the second transition layer having a second transition flexural modulus that is less than the first transition flexural modulus, and wherein an average of the first and second transition flexural moduli is equal to the transition flexural modulus. In some embodiments of the disclosure, the substrate flexural modulus and the outer flexural modulus are substantially equal.

In various embodiments of the disclosure, the reinforcement layer is connected to an outer perimeter of the component and connected to the surface of the substrate, wherein the at least one transition layer is connected to an outer perimeter of the reinforcement layer and connected to the surface of the substrate. In some embodiments of the disclosure, the flexible electronic device further comprises a second component supported by the surface of the substrate; a wire extending between the second component and the component; and a second reinforcement layer positioned between the substrate and the second component, the second reinforcement layer having a second reinforcement flexural modulus that is greater than the substrate flexural modulus. In various embodiments of the disclosure, the flexible electronic device further comprises at least one second transition layer connected to the second reinforcement layer, the at least one second transition layer having a second transition flexural modulus that is less than the second reinforcement flexural modulus, wherein the outer layer is connected to the at least one second transition layer, and the outer flexural modulus is less than the second transition flexural modulus.

In some embodiments of the disclosure, the at least one transition layer is connected to the second reinforcement layer, the transition flexural modulus is less than the second reinforcement flexural modulus. In various embodiments of the disclosure, the reinforcement flexural modulus is between approximately 10 and 20 GPa, and wherein the outer flexural modulus is between approximately 0.01 and 2 GPa. In some embodiments of the disclosure, the reinforcement layer is at least one of an epoxy material or an acrylic material, and wherein the outer layer is at least one of a silicone material or a thermoplastic polyurethane material. In various embodiments of the disclosure, the at least one transition layer is connected to a top surface of the component.

Another particular embodiment of the present disclosure is a method of forming a flexible electronic device, comprising: positioning a component on a substrate, wherein the substrate has a substrate flexural modulus; positioning a reinforcement layer between the component and the surface of the substrate, the reinforcement layer having a reinforcement flexural modulus that is greater than the substrate flexural modulus; forming at least one transition layer to the reinforcement layer, the at least one transition layer having a transition flexural modulus that is less than the reinforcement flexural modulus; and forming an outer layer to the at least one transition layer, the outer layer having an outer flexural modulus that is less than the transition flexural modulus.

In some embodiments of the disclosure, the at least one transition layer comprises a single transition layer that is connected to the reinforcement layer and is connected to the outer layer. In various embodiments of the disclosure, the method further comprises forming a first transition layer to the reinforcement layer, the first transition layer having a first transition flexural modulus that is less than the reinforcement flexural modulus; and forming a second transition layer to the first transition layer, the second transition layer having a second transition flexural modulus that is less than the first transition flexural modulus, wherein an average of the first and second transition flexural moduli is equal to the transition flexural modulus. In various embodiments of the disclosure, the method further comprises forming of the at least one transition layer to the reinforcement layer is by at least one of screen printing, dispensing, casting, low pressure molding, or compression molding.

Yet another particular embodiment of the present disclosure is a method of forming a flexible electronic device, comprising: positioning a component on a substrate, wherein the substrate has a substrate flexural modulus; forming a reinforcement layer between the component and the surface of the substrate, wherein the reinforcement layer has a reinforcement flexural modulus that is greater than the substrate flexural modulus; forming an encapsulate layer to the reinforcement layer, wherein the encapsulate layer has an encapsulate flexural modulus that is substantially equal to the substrate flexural modulus; curing a transition area of the encapsulate layer to have an average transition flexural modulus that is less than the reinforcement flexural modulus and greater than the encapsulate flexural modulus.

In various embodiments of the disclosure, the method further comprises providing a shield over the encapsulate layer during curing of the transition area, wherein the shield allows a first intensity of ultraviolet radiation through the transition area and allows a second intensity of ultraviolet radiation through an outer area, wherein the first intensity is greater than the second intensity. In some embodiments of the disclosure, the transition area is cured with at least one of ultraviolet radiation or increased temperature. In various embodiments of the disclosure, the method further comprises curing a reinforcement area of the encapsulate layer over the component to have an average reinforcement flexural modulus that is greater than the average transition flexural modulus. In some embodiments of the disclosure, the transition area has a polymerization ratio that is greater than a polymerization ratio of the encapsulate layer.

The following definitions may be used in this disclosure.

"A" or "an" entity refers to one or more of that entity. As such, the terms "a" (or "an"), "one or more" and "at least one" can be used interchangeably herein. It is also to be noted that the terms "comprising", "including", and "having" can be used interchangeably.

"At least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as $X_1$-$X_n$, $Y_1$-$Y_m$, and $Z_1$-$Z_o$, the phrase is intended to refer to a single element selected from X, Y, and Z, a combination of elements selected from the same class (e.g., $X_1$ and $X_2$) as well as a combination of elements selected from two or more classes (e.g., $Y_1$ and $Z_o$).

The term "automatic" and variations thereof refer to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" refers to any computer-readable storage and/or transmission medium that participate in providing instructions to a processor for execution. Such a computer-readable medium can be tangible, non-transitory, and non-transient and take many forms, including but not limited to, non-volatile media, volatile media, and transmission media and includes without limitation random access memory ("RAM"), read only memory ("ROM"), and the like. Non-volatile media includes, for example, NVRAM, or magnetic or optical disks. Volatile media includes dynamic memory, such as main memory. Common forms of computer-readable media include, for example, a floppy disk (including without limitation a Bernoulli cartridge, ZIP drive, and JAZ drive), a flexible disk, hard disk, magnetic tape or cassettes, or any other magnetic medium, magneto-optical medium, a digital video disk (such as CD-ROM), any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored. Computer-readable storage medium commonly excludes transient storage media, particularly electrical, magnetic, electromagnetic, optical, magneto-optical signals.

A "computer readable storage medium" may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may be any computer readable medium that is not a computer readable storage medium and that can communicate, propagate, or transport a program for use by or in connection with an instruction execution system, apparatus, or device. A computer readable signal medium may convey a propagated data signal with computer readable program code embodied therein, for example, in baseband or as part of a carrier wave. Such a propagated signal may take any of a variety of forms, including, but not limited to, electro-magnetic, optical, or any suitable combination thereof. Program code embodied on a computer readable signal medium may be transmitted using any appropriate medium, including but not limited to wireless, wireline, optical fiber cable, RF, etc., or any suitable combination of the foregoing.

The terms "determine", "calculate" and "compute," and variations thereof, are used interchangeably and include any type of methodology, process, mathematical operation or technique.

"Means" shall be given its broadest possible interpretation in accordance with 35 U.S.C. § 112(f). Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

The term "module" refers to any known or later developed hardware, software, firmware, artificial intelligence, fuzzy logic, or combination of hardware and software that is capable of performing the functionality associated with that element.

What is claimed is:

1. A method of forming a flexible electronic device, comprising:
    positioning a component on a substrate comprising a conductive layer, wherein the substrate has a substrate flexural modulus;
    positioning a reinforcement layer between the component and a surface of the substrate, the reinforcement layer having a reinforcement flexural modulus that is greater than the substrate flexural modulus;
    forming at least one transition layer to the reinforcement layer, the at least one transition layer having a transition flexural modulus that is less than the reinforcement flexural modulus; and
    forming an outer layer to the at least one transition layer, the outer layer having an outer flexural modulus that is less than the transition flexural modulus.

2. The method of claim 1, wherein the at least one transition layer comprises a single transition layer that is connected to the reinforcement layer and is connected to the outer layer.

3. The method of claim 1, wherein forming at least one transition layer comprises:
    forming a first transition layer to the reinforcement layer, the first transition layer having a first transition flexural modulus that is less than the reinforcement flexural modulus; and
    forming a second transition layer to the first transition layer, the second transition layer having a second transition flexural modulus that is less than the first transition flexural modulus, wherein an average of the first and second transition flexural moduli is equal to the transition flexural modulus.

4. The method of claim 1, wherein forming of the at least one transition layer to the reinforcement layer is by at least one of screen printing, dispensing, casting, low pressure molding, or compression molding.

5. A method of forming a flexible electronic device, comprising:
    positioning a component on a substrate, wherein the substrate has a substrate flexural modulus;
    forming a reinforcement layer between the component and a surface of the substrate, wherein the reinforcement layer has a reinforcement flexural modulus that is greater than the substrate flexural modulus;

forming an encapsulate layer to the reinforcement layer, wherein the encapsulate layer has an encapsulate flexural modulus that is substantially equal to the substrate flexural modulus;

curing a transition area of the encapsulate layer to have an average transition flexural modulus that is less than the reinforcement flexural modulus and greater than the encapsulate flexural modulus.

6. The method of claim 5, further comprising:

providing a shield over the encapsulate layer during curing of the transition area, wherein the shield allows a first intensity of ultraviolet radiation through the transition area and allows a second intensity of ultraviolet radiation through an outer area, wherein the first intensity is greater than the second intensity.

7. The method of claim 5, wherein the transition area is cured with at least one of ultraviolet radiation or increased temperature.

8. The method of claim 5, further comprising:

curing a reinforcement area of the encapsulate layer over the component to have an average reinforcement flexural modulus that is greater than the average transition flexural modulus.

9. The method of claim 5, wherein the transition area has a polymerization ratio that is greater than a polymerization ratio of the encapsulate layer.

* * * * *